United States Patent
Jaffe et al.

(10) Patent No.: US 7,489,725 B2
(45) Date of Patent: Feb. 10, 2009

(54) DECISION FEEDBACK EQUALIZER AND PRECODER RAMPING CIRCUIT

(75) Inventors: Steven T. Jaffe, Irvine, CA (US);
Robindra Joshi, Redondo Beach, CA (US); David Jones, Louisville, CO (US); Thuji Simon Lin, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 445 days.

(21) Appl. No.: 10/848,907

(22) Filed: May 19, 2004

(65) Prior Publication Data
US 2004/0252755 A1    Dec. 16, 2004

Related U.S. Application Data

(60) Continuation of application No. 09/619,125, filed on Jul. 18, 2000, now abandoned, which is a division of application No. 09/550,757, filed on Apr. 17, 2000, now abandoned.

(60) Provisional application No. 60/148,978, filed on Aug. 13, 1999, provisional application No. 60/148,801, filed on Aug. 13, 1999.

(51) Int. Cl.
*H03K 5/159*   (2006.01)

(52) U.S. Cl. .................................. 375/233; 375/348

(58) Field of Classification Search ......... 375/229–236, 375/316, 346, 348
See application file for complete search history.

(56) References Cited

U.S. PATENT DOCUMENTS

| | | | |
|---|---|---|---|
| 4,412,341 A | 10/1983 | Gersho et al. | |
| 4,985,902 A | 1/1991 | Gurcan | |
| 5,050,186 A | 9/1991 | Gurcan et al. | |
| 5,321,512 A | 6/1994 | Huang | |
| 5,414,733 A | 5/1995 | Turner | |

(Continued)

FOREIGN PATENT DOCUMENTS

WO    WO 99/05807 A1    4/1999

(Continued)

OTHER PUBLICATIONS

International Search Report for Application No. PCT/US00/22017, mailed Feb. 23, 2001, 7 pgs.

(Continued)

*Primary Examiner*—Chieh M Fan
*Assistant Examiner*—Jason M. Perilla
(74) *Attorney, Agent, or Firm*—Sterne, Kessler, Goldstein & Fox P.L.L.C.

(57) ABSTRACT

A feedforward filter has a plurality of feedforward filter taps, including a feedforward filter reference tap. The reference tap of the feedforward filter is positioned proximate a center position of the feedforward filter. A ramping circuit assembly has an input port configured to receive at least one decision feedback filter tap coefficient from a decision feedback filter. A coefficient ramping circuit is configured to provide a ramped output for at least one of the decision feedback filter tap coefficients. The ramped output is varied over time from a first value to a second value. The second value is dependent upon the value of a decision feedback filter tap coefficient. An output port of the ramping circuit assembly is configured to communicate information representative of the ramped output(s) to a precoder.

20 Claims, 9 Drawing Sheets

U.S. PATENT DOCUMENTS

| | | | | |
|---|---|---|---|---|
| 5,513,216 | A | * | 4/1996 | Gadot et al. ................. 375/233 |
| 5,581,585 | A | * | 12/1996 | Takatori et al. ............. 375/376 |
| 5,777,910 | A | * | 7/1998 | Lu ............................. 708/323 |
| 5,825,818 | A | * | 10/1998 | Kaku et al. ................. 375/232 |
| 5,835,526 | A | * | 11/1998 | Juntti ......................... 375/233 |
| 5,852,630 | A | * | 12/1998 | Langberg et al. ............ 375/219 |
| 5,881,108 | A | * | 3/1999 | Herzberg et al. ............ 375/296 |
| 6,115,418 | A | * | 9/2000 | Raghavan ................... 375/233 |
| 6,240,133 | B1 | | 5/2001 | Sommer et al. |
| 6,243,425 | B1 | * | 6/2001 | Langberg et al. ............ 375/285 |
| 6,259,751 | B1 | | 7/2001 | Park et al. |
| 6,324,220 | B1 | * | 11/2001 | Sellars ....................... 375/296 |
| 6,792,049 | B1 | * | 9/2004 | Bao et al. ................... 375/285 |
| 2004/0091039 | A1 | * | 5/2004 | Xia et al. .................... 375/233 |

FOREIGN PATENT DOCUMENTS

WO    WO 00/13314 A1    3/2000

OTHER PUBLICATIONS

Morton et al., "Run-Time Precoder Updates for HDSL2", Sep. 3, 1998, Standards Committee T1 - Telecommunications, T1E1.4./980288.

Jaffe et al., U.S. Appl. No. 09/550,757 filed Apr. 17, 2000 (now abandoned).

Jaffe et al., U.S. Appl. No. 09/619,125 filed Jul. 18, 2000 (now abandoned).

* cited by examiner

DECISION FEEDBACK EQUALIZER AND PRECODER RAMPING CIRCUIT

CROSS REFERENCE TO RELATED APPLICATIONS

The present application is a continuation of patent application Ser. No. 09/619,125, filed Jul. 18, 2000 now abandoned, which is a divisional of patent application Ser. No. 09/550,757, filed Apr. 17, 2000 now abandoned, which claims the benefit of U.S. Provisional Patent Application Ser. Nos. 60/148,978, filed Aug. 13, 1999, and entitled DSL ADAPTIVE TOMLINSON ALGORITHMS and 60/148,801, filed Aug. 13, 1999, and entitled DSL EQUALIZER. All these applications are expressly incorporated herein by referenced as though fully set forth in full.

FIELD OF THE INVENTION

The present invention relates generally to electronic communications systems. The present invention relates more particularly to an apparatus and method for enhancing digital communications, such as those taking place via twisted pair telephone lines in digital subscriber line (DSL) systems.

BACKGROUND OF THE INVENTION

Voiceband modems for providing digital communications between computers via twisted pair telephone lines are well known. Voiceband modems are commonly used to provide Internet access by facilitating digital communications between personal computers and Internet Service Providers (ISPs).

Because voiceband modems operate within the limited bandwidth of the Public Switched Telephone Network (PSTN), i.e., 0 Hz to 3,400 Hz, they are only capable of providing data rates up to approximately 56 Kbps.

Due to the increasingly large quantity of digital data being communication via twisted pair telephone lines, the maximum bit rate associated with voiceband modems is frequently considered inadequate. The comparatively slow speed of voiceband modems is a severe limitation when transferring large binary files such as images, film clips, audio, large data files and the like. At 56 Kbps, such files may require an undesirably long amount of time to transfer between computers. Further, many applications, such as those involving realtime video, are not possible at 56 Kbps.

In an attempt to mitigate the data transfer rate limitation associated with such contemporary voiceband modems, integrated services data network (ISDN) modems have been developed. Not only do such ISDN modems increase the data rate to approximately 112 Kbps in some instances, but ISDN also facilitates the use of multiple communications devices simultaneously. For example, an ISDN system may be configured so as to allow the simultaneous transmission of data from a computer and voice from a digital telephone. The use of ISDN necessitates the installation of an ISDN compatible switch by the telephone company.

The increased data rate of ISDN modems with respect to voiceband modems is due both to the use of a substantially larger frequency spectrum, i.e., 0 Hz to 80 kHz instead of 0 Hz to 3,400 Hz, and to the use of a more advanced coding technique, i.e., 2B1Q. According to 2B1Q coding, two bits are transmitted with each symbol, thereby doubling the bit rate.

The increasing popularity of such communication services as video on demand (pay-per-view), realtime video teleconferencing and high speed Internet access has further increased the need for higher data rates over twisted pair telephone lines. Even the comparatively high speed associated with ISDN is not adequate for providing such services, which typically require data rates of at least 1.5 Gbps.

Digital subscriber line (DSL) provides a way of facilitating digital communications over twisted pair telephone lines at data rates in excess of 1.5 Mbps, so as to facilitate such desirable services as video on demand, realtime video teleconferencing, high speed Internet access and the like.

It is worthwhile to note that although fiber optic cable will provide data rates in excess of those possible utilizing DSL on twisted pair telephone lines, the installation of fiber optic cable to customer premises is costly and is expected to take more than a decade. Therefore, it is necessary to leverage (such as via DSL) existing twisted pair copper wiring. It should be noted that this alternative is particularly attractive to telephone companies, since their existing infrastructure provides the telephone companies with a distinct time-to-market advantage in the highly competitive communications business.

There are currently several different versions of DSL available. These include basic digital subscriber line (DSL), high data rate digital subscriber line (HDSL), single line digital subscriber line (SDSL), asymmetric digital subscriber line (ADSL) and very high bit rate digital subscriber line (VDSL).

Basic DSL provides a data rate of 160 Kbps simultaneously in both directions over a single twisted pair of telephone lines for distances of up to approximately 18,000 feet.

HDSL is an extension of basic DSL and provides an improved method for transmitting T1/E1 signals. T1 is used primarily in North America and Japan and facilitates the simultaneous transmission of 24 digitized voice channels. E1 is used in most of the rest of the world and supports up to 30 simultaneous digitized voice channels.

HDSL uses an advanced modulation technique to facilitate a data rate of 1.544 Mbps over a twisted pair telephone line for a distance of up to approximately 12,000 feet. HDSL requires two twisted pair telephone lines, each twisted pair operating at 768 Kbps.

SDSL is a single line version of HDSL. In SDSL, T1/E1 signals are communicated over a single twisted pair. SDSL is suitable for such applications as servers and power LANs, which require symmetric data communications, wherein equal data rates in both the upstream and downstream directions are provided. SDSL is also suitable for such services as private line and frame relay.

ADSL is well suited for video on demand, home shopping, Internet access and remote LAN access, wherein the downstream data rate is comparatively high with respect to the upstream data rate. As mentioned above, the communication of video, such as MPEG movies, can require data rates in excess of 1.5 Mbps. However, this high bit rate is in the downstream direction only. The upstream control signals, which may be from simulated VCR controls, typically require as little as 16 Kbps. It has been found that a ten to one ratio of downstream to upstream data rates is suitable for many such data communications applications.

VDSL, like ADSL, utilizes asymmetric data communications. However, VDSL operates at much higher data rates, which are facilitated by requiring shorter transmission distances via the twisted pair telephone lines. Further, a symmetric version of VDSL may be utilized in multimedia applications requiring similar data rates in both directions.

Approximately 700 million twisted pair copper telephone lines presently interconnect homes and businesses worldwide. Because of this large installed base, telephone companies have a distinct advantage over cable companies in the marketing of data communications services. Further, the cable companies use a shared transmission medium system, wherein a single coaxial cable services a plurality of computers. Thus, although a cable modem may, in some instances, provide higher data rates due to the use of the high bandwidth coaxial cable transmission medium rather than twisted pair copper telephone lines, the data rate actually achieved by a cable modem depends to a great extent upon the number of computers sharing the coaxial cable simultaneously. As more computers communicate via the same coaxial cable, each individual computer's data rate is reduced proportionally.

This reduction in data rate occurs as the plurality of individual computers compete for the limited transmission medium bandwidth of the shared coaxial cable. When more computers simultaneously communicate via the coaxial cable, an inherently smaller bandwidth allocation is provided to each individual computer.

However, when computers communicate via dedicated telephone lines, by way of contrast, their data rate is independent of the communication activities of other computers. Thus, the use of telephone lines to facilitate digital communications has a distinct advantage over cable modem systems. Consequently, the larger installed base of twisted pair telephone lines, as compared to coaxial cable, combined with the dedicated communications capability provided by such telephone lines, makes twisted pair communications a viable alternative to cable modem technology.

The various different types of DSL may be referred to collectively as either DSL or XDSL. DSL utilizes an advanced modulation scheme known as quadrature amplitude modulation (QAM), wherein a combination of amplitude and phase modulation is used to encode digital information for transmission over twisted pair copper telephone lines. QAM is an extension of multiphase shift keying modulation schemes, such as quadrature phase shift keying (QPSK). The primary difference between QAM and QPSK is the lack of a constant envelope in QAM versus the presence of a constant envelope in phase-shift keying techniques.

QAM is based upon suppressed carrier amplitude modulation of two quadrature carriers, i.e., two carriers having a phase relationship of 90 degrees with respect to one another.

Although QAM can have any number of discrete digital levels which the physical media will accommodate, common levels are QAM-4, QAM-16, QAM-64 and QAM-256, wherein the number indicates how many discrete digital levels are utilized.

Thus, it will be appreciated that the use of QAM facilitates the simultaneous transmission of a larger number of bits, e.g., up to 256 bits with QAM-256, so as to provide substantially enhanced bit rates. Each such simultaneous transmission of a plurality of bits is accomplished by encoding the bits into a symbol. Of course, the use of symbols which contain a larger number of bits requires higher signal to noise ratios(SNR).

Although QAM does provide a substantial increase in bit rate, as compared with earlier modulation schemes such as those which are utilized in contemporary voiceband modems and ISDN modems, it is still desirable to optimize the bit rate provided by QAM, so as to provide digital communications at the highest possible speed while maintaining the desired quality of service.

One major problem which inhibits optimization of the bit rate in DSL installations is radio frequency ingress (RFI). RFI occurs when the twisted pair copper wires of a DSL installation function as a radio antenna at the frequencies upon which the DSL transceivers communicate. Although the receiver front ends of DSL transceivers include differential amplifiers and such RFI is generally coupled to the twisted pair in the common mode, not all of the undesirable RFI is eliminated by the differential amplifiers. Leakage of some portion of the RFI past the differential amplifiers inherently occurs since it is not possible to define a twisted pair transmission medium which is completely balanced. Thus, some portion of the RFI is induced in a differential mode and/or some portion of the common mode induced RFI is converted to a differential mode. Of course, any portion of the RFI which is within the frequency range of the differential amplifiers and which is in the differential mode at the input to the differential amplifiers is processed by the differential amplifiers in the same manner as the desired received signal, i.e., is amplified and passed on for further processing. Thus, such differential mode induced RFI undesirably interferes with the received signal and thereby degrades the performance of the DSL system, resulting in an undesirably reduced bit rate.

Therefore, it is desirable to provide a method and apparatus for mitigating the effects of such undesirable RFI, so as to enhance the bit rate in a DSL communications system or the like.

Another problem associated with DSL installations which inhibits optimization of bit rate is intersymbol interference (ISI). ISI occurs in communication systems as the symbols being communicated over a physical medium tend to spread out in time, so as to overlap and substantially interfere with one another. ISI which occurs as a result of one symbol spreading backwardly into another, subsequent, symbol is known as post-cursor ISI. Similarly, ISI caused by one symbol spreading forwardly so as to interfere with another, preceding, symbol is known as pre-cursor ISI. As those skilled in the art will appreciate, when the post-cursor ISI of one symbol, for example, extends into a subsequent symbol, this post-cursor ISI increases the amplitude of the subsequent symbol, thereby potentially causing the subsequent to be misinterpreted by the slicer of the receiver. Of course, pre-cursor ISI has the same detrimental effect on a preceding symbol.

ISI becomes much more detrimental as bit rates increase. As bit rates increase, symbols become much more tightly packed in time, i.e., become closer to one another, such that the symbols are much more subject to the effects of pre-cursor and post-cursor ISI. That is, since the symbols are closer to one another, each symbol overlaps a greater (higher amplitude) portion of the spread portion of an adjacent symbol. Because ISI undesirably interferes with the proper interpretation of the symbols by the slicer, the bit rate must generally be reduced to the point where ISI is acceptable, i.e., does not result in an excessive bit error rate (BER). Therefore, ISI tends to substantially inhibit optimization of bit rate. Thus, it would additionally be desirable to provide a method and apparatus for mitigating the undesirable effects of ISI, so as to facilitate the optimization of bit rate in DSL communications systems and the like.

SUMMARY OF THE INVENTION

The present invention specifically addresses and alleviates the above-mentioned deficiencies associated with the prior art. More particularly, the present invention includes a feedforward filter for mitigating the undesirable effects of radio frequency ingress (RFI) in communication systems, such as DSL installations. The feedforward filter includes a plurality of feedforward filter taps, including a feedforward filter reference tap and each feedforward tap has a coefficient value associated therewith. According to one aspect of the present invention, the reference tap, defined as that tap having the largest coefficient value, is positioned proximate the center of the feedforward filter.

Thus, a receiver for a DSL communication system or like includes a feedforward filter coupled to process signals received by the receiver. The feedforward filter has a plurality of feedforward filter taps, including a feedforward filter reference tap. A feedback filter is coupled to receive signals representative of an output of the feedforward filter. The feedback filter has a plurality of feedback filter taps. The feedforward filter reference tap is located proximate a center position of the feedforward filter, so as to enhance noise cancellation in a DSL communication system or the like.

According to one aspect of the present invention, a transceiver is defined which includes a transmitter and a receiver. The receiver includes a feedforward filter coupled to process signals received by the receiver. The feedforward filter has a plurality of feedforward filter taps, including a feedforward filter reference tap. A feedback filter is coupled to receive signals representative of an output of the feedforward filter. The feedback filter has a plurality of feedback filter taps. The feedforward filter reference tap is located proximate a center position of the feedforward filter, so as to enhance noise cancellation in a DSL communication system or the like.

According to another aspect of the present invention, a communication system includes a plurality of transceivers, at least two of which are configured to communicate with one another. Each transceiver includes a transmitter and a receiver. Each receiver includes a feedforward filter coupled to process signals received by the receiver, the feedforward filter has a plurality of feedforward filter taps, including a feedforward filter reference tap. A feedback filter is coupled to receive signals representative of an output of the feedforward filter. The feedback filter has a plurality of feedforward filter taps. The feedforward filter reference tap is located proximate a center position of the feedforward filter, so as to enhance noise cancellation in a DSL communication system or the like.

Thus, the present invention includes a method for mitigating noise in a communication device, wherein the method includes filtering a received signal with a feedforward filter and the feedforward filter includes a plurality of feedforward filter taps, including a feedforward filter reference tap. Each of the feedforward filter taps has a coefficient. The reference tap is located proximate a center position of the feedforward filter.

According to another aspect, the present invention includes a ramping circuit for facilitating inhibition of the undesirable effects of intersymbol interference (ISI). The ramping circuit includes an input port configured to receive at least one decision feedback filter tap coefficient from a decision feedback filter and a coefficient ramping circuit configured to provide a ramped output for at least one of the decision feedback filter tap coefficients, wherein the ramped output is ramped over time from a first value to second value. The second value is dependent upon a decision feedback filter tap coefficient. An output port of the ramping circuit is configured to communicate information representative of the ramped output(s) to a precoder. According to one aspect, the present invention includes a receiver having a decision feedback filter and a ramping circuit assembly. The ramping circuit assembly includes an input port configured to receive at least one decision feedback filter tap coefficient from the decision feedback filter. A coefficient ramping circuit is configured to provide a ramped output for at least one of the decision feedback filter tap coefficients. The ramped output is ramped over time from a first value to a second value, wherein the second value is dependent upon a decision feedback filter tap coefficient. An output port of the ramping circuit assembly is configured to communicate information representative of the ramped output(s) to a precoder of a remotely located transmitter.

According to an alternative aspect, the present invention includes a transmitter having a precoder and a ramping circuit assembly. The ramping circuit assembly includes an input port configured to receive at least one decision feedback filter tap coefficient from a decision feedback filter of a remotely located receiver. A coefficient ramping circuit is configured to provide a ramped output for at least one of the decision feedback filter tap coefficients. The ramped output is ramped over time from a first value to a second value, wherein the second value is dependent upon a decision feedback filter tap coefficient. An output port is configured to communicate information representative of the ramped output(s) to the precoder of the transmitter.

According to a further aspect of the present invention, a transceiver has a decision feedback filter, a precoder, and a ramping circuit assembly. The ramping circuit assembly includes an input port configured to receive at least one decision feedback filter tap coefficient from the decision feedback filter of the same transceiver. A coefficient ramping circuit is configured to provide a ramped output for at least one of the decision feedback filter tap coefficients. The ramped output is ramped over time from a first value to a second value, wherein the second value is dependent upon a decision feedback filter tap coefficient. An output port is configured to communicate information representative of the ramped output(s) to a precoder of a complimentary transceiver.

According to a further aspect of the present invention, a transceiver includes a decision feedback filter, a precoder and a ramping circuit assembly. The ramping circuit assembly includes an input port configured to receive at least one decision feedback filter tap coefficient from a decision feedback filter of a complimentary transceiver. A coefficient ramping circuit is configured to provide a ramped output for at least one of the tap coefficients of the complimentary decision feedback filter. The ramped output is ramped over time from a first value to a second value, wherein the second value is dependent upon the tap coefficient of the complimentary decision feedback filter. An output port is configured to communicate information representative of the ramped output(s) to the precoder of the same transceiver.

According to an further aspect, the present invention includes a communication system which has at least two transceivers. Each transceiver includes a decision feedback filter and a precoder. A ramping circuit assembly of at least one transceiver has an input port configured to receive at least one decision feedback filter tap coefficient from the decision feedback filter of the same transceiver and a coefficient ramping circuit configured to provide a ramped output for at least one of the decision feedback filter tap coefficients. The ramped output is ramped over time from a first value to a second value. The second value is dependent upon a decision feedback filter tap coefficient. An output port is configured to communicate information representative of the ramped output(s) to a precoder of a complimentary transceiver.

According to an alternative aspect, the present invention includes a communication system having at least two transceivers. Each transceiver includes a decision feedback filter and a precoder. A ramping circuit assembly of at least one transceiver includes an input port configured to receive at least one decision feedback filter tap coefficient from a decision feedback filter of a complimentary transceiver and a coefficient ramping circuit configured to provide a ramped output for at least one of the tap coefficients of the complimentary decision feedback filter. The ramped output is ramped over time from a first value to a second value. The second value is dependent upon the coefficient of the complimentary decision feedback filter tap. An output port is configured to communicate information representative of the ramped output(s) to the precoder.

These, as well as other features of the present invention will be more apparent from the following description and drawings. It is understood that changes in the specific structure shown and described may be made within the scope of the claims without departing from the spirit of the invention.

DETAILED DESCRIPTION OF THE INVENTION

Figure 1:
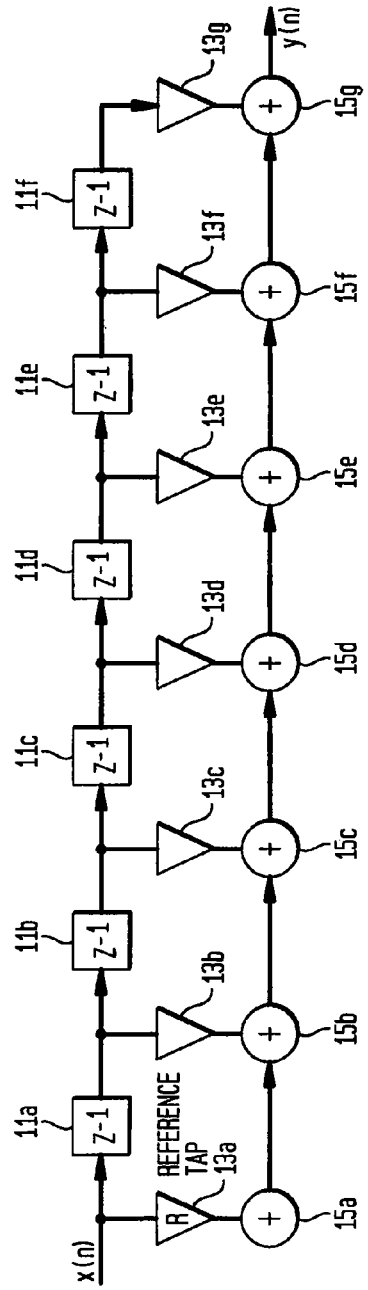
FIG. 1 is a schematic representation of a contemporary feedforward filter, wherein the reference tap thereof is located at one end thereof, e.g., at the beginning, thereof.

The detailed description set forth below in connection with the appended drawings is intended as a description of the present embodiments of the invention and is not intended to represent the only forms in which the present invention may be constructed or utilized. The description sets forth the functions of the invention and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Although the present invention is described and illustrated herein as being implemented—in a digital subscriber line (DSL) system, such is by way of example and not by way of limitation. As those skilled in the art will appreciate, the present invention is suitable for application in a variety of different types of communication systems.

As discussed in detail above, one major problem associated with the application DSL involves the need to reduce the bit rate of communications between DSL transceivers in order to compensate for the undesirable effects of radio frequency ingress (RFI). One particularly effective method for at least partially canceling the undesirable effects of RFI involves the use of a decision feedback equalizer. The use of a decision feedback equalizer in such a DSL receiver is somewhat effective in facilitating the cancellation of undesirable RFI.

A desired technique for further mitigating the detrimental effects of RFI is to move the main or reference tap from one end of a feedforward filter of the decision feedback equalizer of the receiver to the center position of the feedforward filter. Moving the reference tap from one end of the feedforward filter to the middle of the feedforward filter allows the feedforward filter to use more of the incoming signal pulse in order to perform noise whitening. This de-correlates the RFI substantially better than when the reference tap is placed at either end of the feedforward filter.

However, moving the reference tap from either end of the feedforward filter to the middle thereof causes the coefficient values of the taps of the feedback filter of the decision feedback equalizer to increase undesirably in amplitude. Large feedback filter tap coefficient values tend to substantially worsen error propagation. Error propagation occurs in a decision feedback equalizer when an initial decision error is fed back into the feedback filter and this initial decision error results in further incorrect decisions.

According to the present invention, the reference tap is moved to proximate the center of the feedforward filter and error propagation is mitigated by not allowing the feedback filter tap coefficient values to become excessively large. If the feedback filter tap coefficients are not allowed to assume values which are greater than a predetermined clamp value, then error propagation can be substantially mitigated.

Thus, according to the present invention, feedback filter tap clamp values are provided so as to effect limiting of the feedback filter tap coefficient values in a manner which substantially mitigates error propagation. Tap clamp values may be applied separately to the real and imaginary portions of each tap, or alternatively, may be applied only to the magnitude of the tap. According to the present invention, a trade-off or balance between tap clamp value and performance loss is achieved. The present invention provides superior RFI rejection, while simultaneously controlling error propagation.

Thus, according to the present invention, the feedforward filter includes a plurality of feedforward filter taps, including a feed filter reference tap. As those skilled in the art will appreciate, the reference tap is that tap which contains the largest coefficient value and is, according to contemporary practice, positioned at one end of the filter.

Each feedforward filter tap has a coefficient value associated therewith. According to the present invention, the reference tap is positioned proximate a center position of the feedforward filter. Therefore, according to the present invention, the largest coefficient value is contained within a tap which is positioned proximate the center position of the feedforward filter. According to the present invention, the reference tap is generally positioned at the center position of the feedforward filter. However, the reference tap may alternatively be located at a position near the center, but not at the center of the feedforward filter. Thus, according to the present invention, the largest coefficient value is typically located at the center tap.

The feedforward filter of the present invention may be implemented so as to define a portion of a decision feedback equalizer of a receiver, such a DSL transceiver, for example. Thus, according to the present invention, a receiver, which may define a portion of a DSL transceiver or the like, includes a feedforward filter coupled to process signals received by the receiver. The feedforward filter has a plurality of feedforward filter taps, including a feedforward filter reference tap.

A feedback filter is coupled to receive signals representative of an output of the feedforward filter. The feedback filter has a plurality of feedback filter taps. The feedforward filter reference tap is positioned proximate a center position, generally at the center position, of the feedforward filter, so as to enhance noise cancellation. As those skilled in the art will appreciate, positioning the feedforward filter reference tap proximate the center position of the feedforward filter tends to enhance error propagation through the decision feedback equalizer.

In order to mitigate error propagation, the value of at least one of the coefficients of the feedback filter taps is clamped. As used herein, clamping is defined as limiting the value of a filter tap coefficient to a maximum value. The maximum value may either be predetermined and fixed or, alternatively, may be adaptive or variable. The maximum value may be determined by calculation, by simulation, empirically, by trial and error, or by any combination of these. The tap coefficient clamping value may be adaptive, or dependent upon the communication parameters and environment as these factors vary with time.

Thus, according to the present invention, the feedforward filter and the feedback filter cooperate so as to at least partially define a decision feedback equalizer, such as that of a DSL transceiver. A communication system includes a plurality, i.e., at least two, such transceivers which are configured to communicate with one another.

As discussed in detail above, another major problem associated with the application of DSL involves the need to reduce the bit rate of communications between DSL transcribers in order to compensate for the undesirable effects of intersymbol interference (ISI). One common method for mitigating ISI in communication systems involves the use of a decision feedback equalizer. Decision feedback equalizers are very effective in mitigating post-cursor ISI. However, there are several disadvantages associated with the use of such decision feedback equalizers. For example, the undesirable effects of error propagation which occur when the coefficient values of the taps of a decision feedback equalizer become too large, as discussed above, provide a serious disadvantage in the use of decision feedback equalizers. The burst of errors which result when error propagation occurs seriously degrades the bit error rate performance of the system. Additionally, the burst of errors can also cause the decision feedback equalizer to diverge, thereby causing the entire receiver to lose synchronization and typically resulting in breaking of the communication link between DSL transceivers.

One method for mitigating such error propagation involves the use of a Tomlinson-Harashima precoder. According to the contemporary use of a Tomlinson-Harashima precoder, a decision feedback equalizer is provided at the transmitter. Since no decision errors can be made at the transmitter, there can be no resulting error propagation.

However, one problem associated with the use of a Tomlinson-Harashima precoder is that of finding the correct taps to use in the Tomlinson-Harashima precoder. A second problem associated with the use of a Tomlinson-Harashima precoder is that of coordinating use of the taps in the decision feedback equalizer of the transmitter with the taps of the decision feedback equalizer of the receiver. As those skilled in the art will appreciate, some degree of coordination between the taps of the decision feedback equalizer of the transmitter and the taps of the decision feedback equalizer of the receiver is necessary, since these taps do, to a very great degree, perform similar and mutually exclusive functions.

According to contemporary practice, the values of the Tomlinson-Harashima precoder taps are identified by allowing the conventional decision feedback equalizer of the receiver to converge. Then, the coefficient values of the taps of the decision feedback equalizer of the receiver are transferred to the decision feedback equalizer of the Tomlinson-Harashima precoder of the transmitter and the Tomlinson-Harashima precoder of the transmitter is enabled while the decision feedback equalizer of the receiver is disabled.

However, this contemporary approach suffers from several distinct disadvantages. For example, some method must be defined for allowing the transmitter to signal to the receiver that it is now time to disable the decision feedback equalizer of the receiver. This must be performed in a manner which does not disrupt communications. That is, it is necessary to enable the Tomlinson-Harashima precoder, while simultaneously disabling the decision feedback equalizer of the receiver.

Further, the conditions of the communication channel between the two transceivers may evolve over the course of a particular communication session, thereby rendering the initial Tomlinson-Harashima precoder taps invalid. Thus, after such evolution, the Tomlinson-Harashima precoder taps would no longer model the channel correctly and the resulting communications would tend to be less effective, e.g., may only be performed at a lower bit rate.

According to the present invention, a coefficient ramping circuit is utilized to gradually provide tap coefficients from the feedback filter of a receiver, such as that of a DSL transceiver, to a precoder, typically a Tomlinson-Harashima precoder, of a transmitter, such as that of a DSL transceiver. The coefficient ramping circuit is configured to provide a ramped output for at least one of the decision feedback filter tap coefficients. The coefficient ramping circuit is typically configured to provide a ramped output for all of the decision feedback filter tap coefficients. The ramped output is ramped over time from a first value to a second value. The second value typically depends upon the converged value of the feedback filter tap coefficient(s).

Either the unramped (full or final value) coefficients or the ramped (gradually changing) coefficients are communicated from the decision feedback filter of the receiver to the Tomlinson-Harashima precoder via the same communication channel upon which data is communicated between the transmitter and the receiver. Alternatively, the unramped coefficients or the ramped coefficients may be transmitted from the decision feedback filter to the Tomlinson-Harashima precoder via any other desired channel.

As mentioned above, either unramped or ramped coefficients may be communicated from the decision feedback filter to the Tomlinson-Harashima precoder. When unramped coefficients are communicated from the decision feedback filter to the Tomlinson-Harashima precoder, then a coefficient ramping circuit is located generally proximate or within the Tomlinson-Harashima precoder, so as to effect ramping of the tap coefficients. When ramped tap coefficients are communicated from the receiver to the transmitter, then a coefficient ramping circuit is located generally proximate or within the receiver so as to effect ramping of the tap coefficients and communication of ramped values from the receiver to the transmitter.

Generally, the ramping circuit will ramp each filter tap coefficient from a value of approximately zero to a value approximately equal to the value of the corresponding feedback filter tap coefficient. However, those skilled in the art will appreciate that various other initial and final values may be suitable. Thus, for example, an initial value other than zero may be utilized so as to enhance the rate at which the Tomlinson-Harashima precoder converges. Further, a final tap coefficient value other than the actual tap coefficient value of the decision feedback filter may be utilized, so as to ensure continued functioning of the decision feedback filter, for example.

As those skilled in the art will appreciate, by making the final ramped tap coefficient values of the Tomlinson-Harashima precoder less than the actual converged tap coefficient values of the feedback filter of the receiver, the Tomlinson-Harashima precoder performs insufficient precoding to allow the decision feedback filter tap coefficient values of the receiver to go completely to zero. Thus, when tap coefficient values less than those of the decision feedback equalizer are loaded into the Tomlinson-Harashima precoder, the decision feedback equalizer of the receiver will continue to function. This continued functioning of the decision feedback equalizer of the receiver may be desirable in some circumstances.

It is generally desirable to maintain functioning of the decision feedback filter of the receiver so as to continue to compensate for evolving conditions of the communication channel between the two transceivers. Thus, as the channel conditions change, such changes are compensated for by the continued functioning of the decision feedback equalizer. As the decision feedback equalizer accommodates such continuing evolution of the communication channel, the ramping circuit generally communicates such changes in the coefficient values of the decision feedback filter to the Tomlinson-Harashima precoder of the transmitter, so as to facilitate generally continuous updating of the coefficient values of the Tomlinson-Harashima precoder of the transmitter. Such updating of the coefficient values of the Tomlinson-Harashima precoder of the transmitter tends to drive the coefficient values of the decision feedback filter to zero, or some other, generally low, predetermined value.

When the coefficient ramping circuit is located at the receiver, then either the actual ramped coefficient values may be communicated to the transmitter or, alternatively, delta or difference values may be communicated from the receiver to the transmitter. Such difference values, which typically represent the difference between the last unramped coefficient value and the next unramped coefficient value, may be communicated so as to mitigate communication bandwidth associated therewith.

The coefficient ramping circuit may be configured so as to ramp the coefficient values either linearly or non-linearly, such as exponentially, for example.

Thus, according to the present invention, the decision feedback equalizer first converges without the Tomlinson-Harashima precoder being enabled. Then, the decision feedback equalizer tap coefficient values are transferred to the transmitter via a control channel. The control channel is typically merely the same media upon which the transmitter communicates with the receiver, e.g., twisted pair telephone lines. However, those skilled in the art will appreciate that the control channel may alternatively be defined by any other suitable media.

Thus, instead of merely loading the full decision feedback filter tap coefficient values into the Tomlinson-Harashima precoder and then signaling to the decision feedback filter of the receiver that the Tomlinson-Harashima precoder is enabled, as is done according to contemporary practice, the coefficient values are ramped into the Tomlinson-Harashima precoder according to the present invention.

In this manner, the decision feedback equalizer coefficient values are transferred to the Tomlinson-Harashima precoder of the transmitter without losing synchronization and without disabling the decision feedback equalizer of the receiver.

Thus, according to the present invention, close synchronization between the transmitter and receiver so as to effect disabling of the decision feedback equalizer of the receiver while simultaneously enabling the decision feedback equalizer of the Tomlinson-Harashima precoder is not necessary. Instead, the tap coefficient values are slowly ramped into the Tomlinson-Harashima precoder, thus avoiding the need for such synchronization and also providing the undesirable consequences associated with failure to properly synchronize this procedure.

As the Tomlinson-Harashima precoder taps rise toward their final values, the corresponding taps of the decision feedback equalizer of the receiver change slowly in response to the rising of the taps in the Tomlinson-Harashima precoder. The slow changing of the coefficient values of the decision feedback equalizer substantially mitigates the likelihood of the operation of the decision feedback equalizer being disrupted. When the Tomlinson-Harashima precoder taps have ramped to their final values, then the decision feedback equalizer tap coefficient values will, due to their adaptive nature, tend to be approximately zero. When the coefficient values of the decision feedback equalizer of the receiver have reached approximately zero, then the decision feedback equalizer of the receiver is effectively disabled. At this time, the decision feedback equalizer of the receiver may, if desired, be actually disabled. Alternatively, the decision feedback equalizer of the receiver may remain enabled, so as to accommodate future changes in channel conditions.

Thus, according to the present invention, only very loose coordination or synchronization between the transmitter and receiver is required. That is, it is only necessary to send the original unramped tap coefficient values (which are then ramped at the receiver) or the ramped tap coefficient values resulting therefrom from the receiver to the transmitter and then, optionally, to notify the receiver that ramping of the coefficients has commenced. Such notification of the receiver by the transmitter that ramping of the coefficients has commenced may, if desired, be utilized to facilitate coordination of the ramping process. That is, such coordination may be utilized to ensure that ramped or unramped decision feedback filter coefficient values are transmitted from the receiver to the transmitter only as required.

One major benefit of the present invention is that the decision feedback equalizer of the receiver does not necessarily have to be disabled. Thus, the decision feedback equalizer of the receiver may be utilized to track further changes in the communication channel.

As mentioned above, various different methods for ramping the decision feedback filter tap coefficients may be utilized. For example, the decision feedback filter tap coefficient values may be ramped either linearly or exponentially. Linear ramping is generally accomplished by adding a fixed quantity to each of the decision feedback filter tap coefficients during each of a plurality of ramping iterations. For example, suppose that a particular decision feedback filter tap coefficient value to be ramped and loaded into a corresponding tap of the Tomlinson-Harashima precoder has a value of C and the fixed amount to be added during each ramping iteration is D. Then, starting from an initial ramped value of zero, the ramped decision feedback filter tap coefficient values will be 0, D, 2D, 3D, . . . This process continues until the final value of C is reached or approximated. Thus, a total of C/D ramping iterations are necessary.

Exponential ramping is similar to linear ramping, except that instead of adding a fixed amount to the present ramping value during each ramping iteration, a percentage of the remaining value to be ramped is added to the value resulting from the previous iteration. As those skilled in the art will appreciate, such exponential ramping will generally result in more rapid convergence of the Tomlinson-Harashima precoder. For example, again suppose that the decision feedback filter tap coefficient value to be ramped to is C. If the coefficient value during each iteration is defined as C(n), then C(n) would be defined as follows: $C(n+1)=C(n)+\mu [C-C(n)]$, where $\mu$ controls the rate at which the coefficient is loaded. Initially, $C(0)=0$. Setting $\mu=1$ corresponds to the contemporary practice for loading Tomlinson-Harashima precoder coefficients. Thus, when $\mu=1$, the entire decision feedback filter tap coefficient values are loaded at once.

When the channel conditions change during a communication session, then the tap coefficient values of the Tomlinson-Harashima precoder may be updated in a fashion similar to the way in which the tap coefficient values of the Tomlinson-Harashima precoder were initially ramped. However, since the Tomlinson-Harashima precoder will contain values other than zero, as a result of the previous ramping process, then such a change in channel conditions will result in ramping from the old Tomlinson-Harashima precoder tap coefficient values to new Tomlinson-Harashima precoder tap coefficient values in a similar manner.

The present invention facilitates continuous adaptive updating of the Tomlinson-Harashima precoder. By way of contrast, according to contemporary practice, channel estimation is performed in the receiver, such as via the decision feedback equalizer, and then the decision feedback equalizer tap coefficient values are transmitted to the Tomlinson-Harashima precoder of the transmitter. According to contemporary practice, if the channel conditions change, then the Tomlinson-Harashima precoder will tend to degrade in effectiveness, since the taps in the Tomlinson-Harashima precoder are not being updated so as to generally continuously match the changing channel conditions, as is done according to the present invention.

Various different methods may be utilized according to the present invention to update the tap coefficient values of the Tomlinson-Harashima precoder. For example, the receiver may transmit an error signal to the transmitter and then an adaptive Tomlinson-Harashima precoder of the transmitter utilizes the error term so as to change its tap coefficient values in a manner which tends to minimize the error. Alternatively, the receiver may transmit residual decision feedback equalizer tap coefficient values to the transmitter such that a convolutional update of an adaptive Tomlinson-Harashima precoder's tap is facilitated. As a further alternative, the receiver may transmit residual decision feedback equalizer tap coefficients to the transmitter and the Tomlinson-Harashima precoder taps of the transmitter may then be updated, one at a time, for example, so as to mitigate abrupt changes in the operation of the Tomlinson-Harashima precoder of the transmitter as it cooperates with the decision feedback filter of the receiver.

Thus, the present invention includes two important aspects thereof, which may be used independently or in combination with one another in order to enhance digital communications such as those employing quadrature amplitude modulation (QAM), e.g., DSL. According to the first important aspect of the present invention, the reference tap of a receiver's feedforward filter is moved to a position proximate the center of the feedforward filter and the coefficient values of the reference taps of the decision feedback filter of the receiver are clamped. According to the second important aspect of the present invention, a Tomlinson-Harashima precoder uses ramped tap coefficient values.

The centered reference tap and clamped decision feedback equalizer tap coefficient values of the present invention are discussed with reference to FIGS. 1-3. The ramping of tap coefficients for the Tomlinson-Harashima precoder is discussed with reference to FIGS. 4-7. An exemplary DSL implementation of both aspects of the present invention is discussed with reference to FIGS. 8-10.

Figure 2:
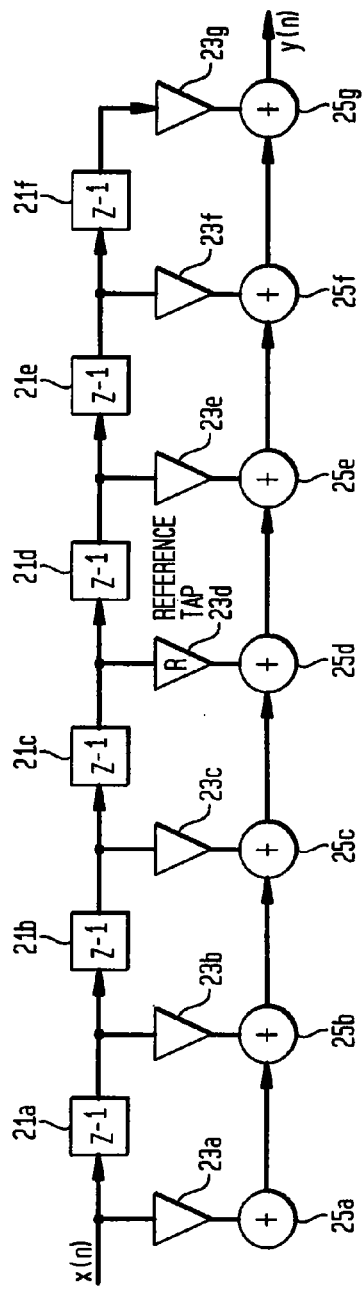
FIG. 2 is a schematic representation of a feedforward filter formed according to the present invention, wherein the reference tap thereof is located proximate, e.g., located at, the center thereof.
Figure 3:
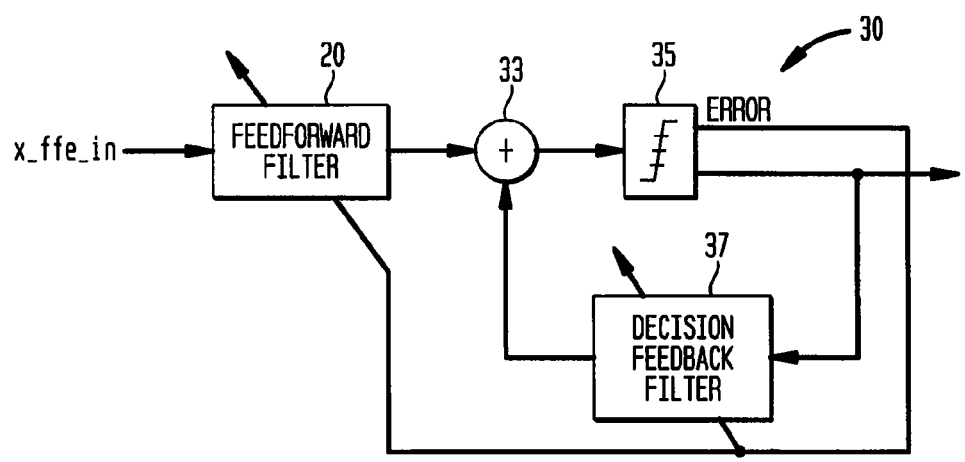
FIG. 3 is a simplified block diagram of a contemporary decision feedback equalizer according to the present invention.

Referring now to FIGS. 1-3, an exemplary implementation of the first aspect of the present invention is described in detail. With particular reference to FIG. 1, a contemporary feedforward filter 10 includes a plurality of delays 11a-11f which cooperate with a plurality of taps 13a-13g and a corresponding plurality of adders 15a-15g, so as to filter input signal x(n) in order to provide a desired filtered output signal y(n), according to well-known digital signal processing (DSP) principles.

According to contemporary practice, the reference tap 13a is located at one end, e.g., the beginning, of the feedforward filter 10. As those skilled in the art will appreciate, the reference tap is that tap which contains the largest coefficient value.

With particular reference to FIG. 2, a feedforward filter 20, formed according to the present invention, includes a plurality of delays 21a-21f which cooperate with a plurality of taps 23a-23g and a corresponding plurality of adders 25a-25g, so as to filter input signal x(n) in order to provide a desired filtered output signal y(n).

According to the present invention, the reference tap 23d is located proximate the center of the feedforward filter 20. More particularly, according to the exemplary feedforward filter 20 of the present invention as shown in FIG. 2, the reference tap 23d is located at the center of the feedforward filter 20.

As discussed in detail above, moving the reference tap from one end of the feedforward filter to proximate the middle of the feedforward filter allows the feedforward filter to use more of the incoming signal pulse in order to perform noise whitening.

Further, as discussed in detail above, moving the reference tap from one end of the feedforward filter to proximate the middle of the feedforward filter causes the coefficient values of the taps of the feedback filter (such as that of FIG. 3) of the decision feedback equalizer to increase undesirably in amplitude in comparison to the coefficient values of the taps of the feedback filter when the reference tap is placed at one end of the feedforward filter. Such increasing of the amplitude of the feedback filter tap coefficient values tends to substantially worsen error propagation.

Therefore, according to the present invention, the reference tap is moved to proximate the center of the feedforward filter and error propagation is mitigated by clamping the feedback filter tap coefficient values, such that they are not permitted to grow to excessively large values. The value at which the feedback filter tap coefficient values are clamped may be determined empirically, by calculation, by simulation or by any other suitable method.

Referring now to FIG. 3, according to the present invention, a decision feedback equalizer 30 includes a feedforward filter 20 having a reference tap 23d (FIG. 2) located proximate a center thereof. The feedforward filter 20 provides an output to adder 33. An output of the adder 33 is provided to slicer 35. The slicer 35 provides an error signal output to the feedforward filter 20 and also to a decision feedback filter 37. The feedforward filter 20 and the decision feedback filter 37 use the error signal to vary the coefficients of the taps of the feedforward filter 20 and the decision feedback filter 37, according to well-known principles. The decision feedback filter 37 provides an output to adder 33.

The feedforward filter 20 mitigates pre-cursor intersymbol interference (ISI) and the decision feedback filter 37, in cooperation with the slicer 35, mitigates post-cursor ISI, according to well-known principles.

As those skilled in the art will appreciate, the decision feedback filter 37 includes a digital filter similar to that of the feedforward filter 20, as shown in FIG. 2. In order to mitigate the propagation of errors, as caused by the placement of the reference tap 23d of the feedforward filter 20 proximate the center thereof, the coefficient values of at least one of the taps of the decision feedback filter 37 are clamped. Typically, the coefficient values of all of the taps of the decision feedback filter 37 are clamped. However, the coefficient values of any desired combination of the taps of the decision feedback filter 37 may be clamped, as desired. Generally, only the coefficient values of those taps of the feedback filter 37 which tend to increase undesirably in response to moving the reference tap 23d of the feedforward filter 20 to the center thereof need to be clamped.

Clamping the coefficient values of the tap(s) of the decision feedback filter 37 is defined as limiting the coefficient values to a predetermined maximum value. This predetermined maximum value may be determined either by calculation, simulation, experimentation or any other suitable method, as mentioned above.

Figure 4:
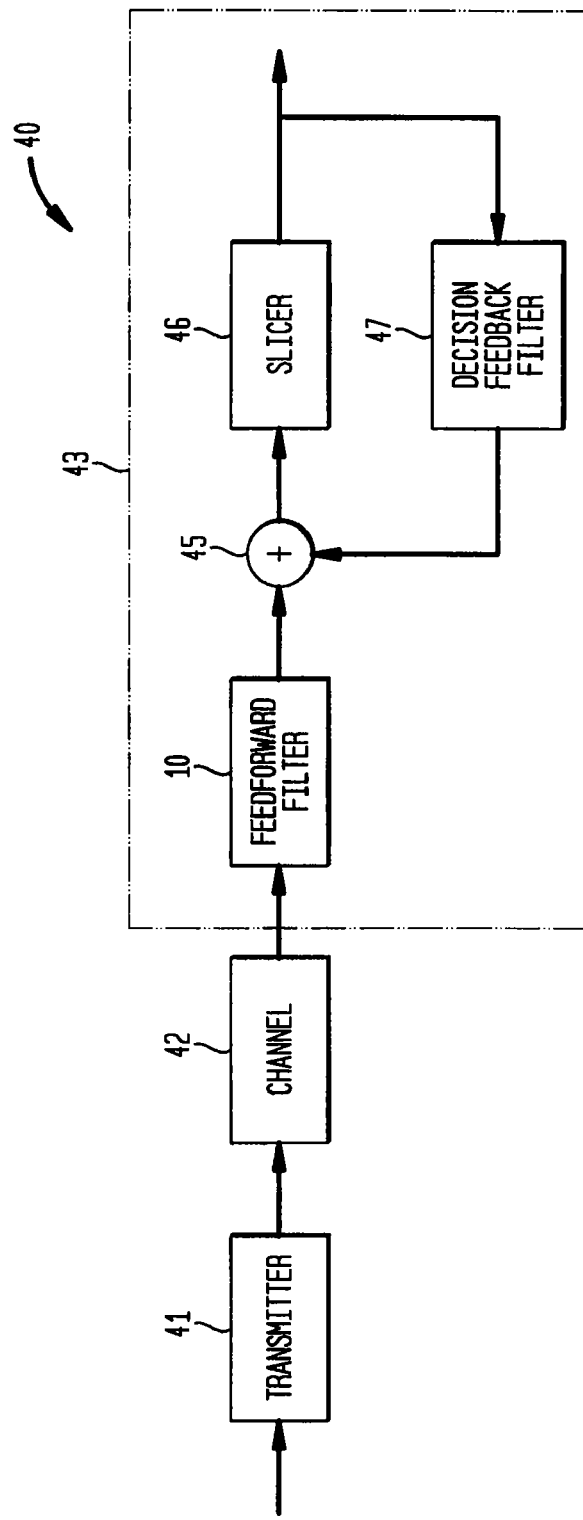
FIG. 4 is a simplified block diagram of a contemporary communication system which includes a transmitter and a receiver, wherein the receiver is partially defined by a feedforward filter, a adder, a slicer and a decision feedback filter.

Referring now to FIGS. 4-7, an exemplary implementation of a second aspect of the present invention is described in detail. With particular reference to FIG. 4, a contemporary communication system 40 includes a contemporary transmitter 41, such as a DSL quadrature amplitude modulation (QAM) transmitter, which transmits via a channel 42 to a contemporary receiver 43.

The contemporary receiver 43 includes a feedforward filter 10 which provides an output to adder 45. The feedforward filter 10 has a reference tap 13a at the front end thereof, as shown in FIG. 1. Adder 45 provides an output to slicer 46. The slicer 46 provides both an input to decision feedback filter 47 and an output which is used for further processing of the received signal, according to well-known principles.

Figure 5:
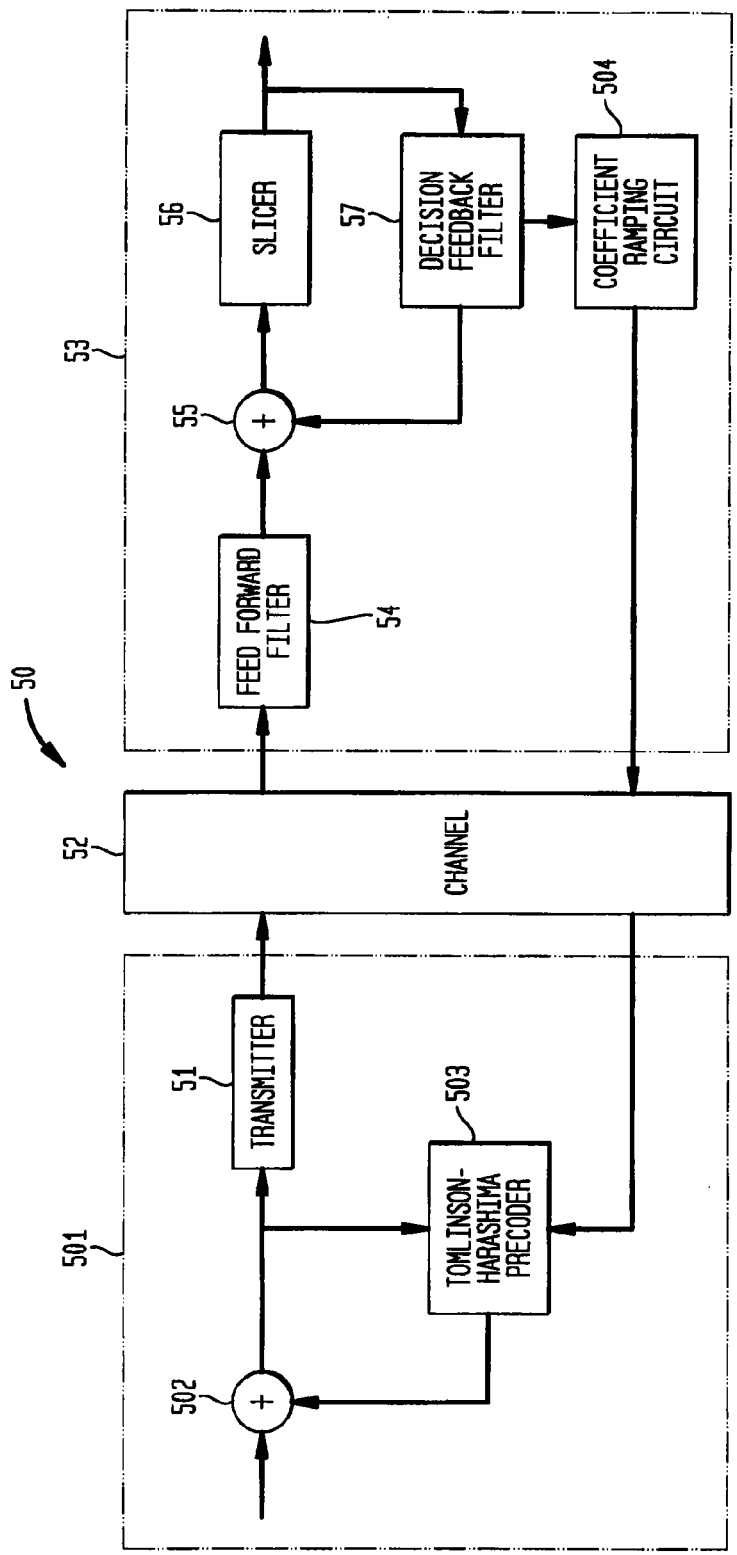
FIG. 5 is a simplified block diagram of two transceivers communicating over a channel, wherein ramped coefficients are transmitted over the channel according to the present invention.

With particular reference to FIG. 5, according to the present invention, tap coefficients from a decision feedback filter 57 of receiving transceiver 53 are ramped and communicated to a Tomlinson-Harashima precoder 503 of transmitting transceiver 501.

More particularly, according to the present invention, transmitting transceiver 501 includes a adder 502 which receives a signal to be transmitted and which receives the output of Tomlinson-Harashima precoder 503. The output of the adder 502 is provided to the Tomlinson-Harashima precoder 503 and to transmitter 51, which transmits via channel 52 to receiving transceiver 53.

Receiving transceiver 53 receives an input from the channel 52, which is provided to feedforward filter 54. The output of the feedforward filter 54 is provided to adder 55, which provides an output to slicer 56. Slicer 56 both provides an input to decision feedback filter 57 and provides an output for further processing, as described above. Decision feedback filter 57 provides an input to adder 55.

According to the present invention, at least one, typically all of the filter coefficient values of the decision feedback filter 57 are provided to coefficient ramping circuit 504. Any desired combination of the coefficients of the decision feedback filter 57 may be provided to the coefficient ramping circuit 504. Coefficient ramping circuit 504 ramps, e.g., gradually changes, the values output therefrom from an initial value, e.g., an initial value near zero, to a final value, e.g., the converged value of each tap of decision feedback filter 57. The output of the coefficient ramping circuit 504 is communicated via channel 52 to the Tomlinson-Harashima precoder 503 of the first transceiver 501.

It is worthwhile to note that, during continued operation of the coefficient ramping circuit 504, coefficient values from the decision feedback filter 57 may be ramped in either direction, i.e., either up or down. That is, after the decision feedback filter 57 coefficient values have initially been ramped from zero to a final value, that final value may change, either up or down, as channel 52 conditions vary. Thus, continued ramping of the decision feedback filter 57 coefficient values by the coefficient ramping circuit 504 can be in either direction, so as to compensate for such variations in conditions of the channel 52.

The ramped coefficient values are utilized by Tomlinson-Harashima precoder 503 to facilitate precoding of the information transmitted by transmitting transceiver 501 to the receiving transceiver 53.

Thus, according to the present invention, the Tomlinson-Harashima precoder 503 of the transmitting transceiver 501 gradually incorporates the tap coefficient values of the decision feedback filter 57, such that precoding of the information transmitted by transmitting transceiver 501 is accomplished gradually, thereby mitigating the occurrence of abrupt changes in the signal communicated via transmitting transceiver 501 through channel 52 to receiving transceiver 53. In this manner, abrupt changes in the signal output by transmitting transceiver 501 are mitigated and the likelihood of interrupted communications between the transmitting transceiver 501 and the receiving transceiver 53 due to loss of synchronization by the receiving transceiver 53 are similarly mitigated.

Further, after the coefficient values utilized by the Tomlinson-Harashima precoder 503 have been ramped to approximately their full values, then the decision feedback filter 57 may optionally be employed to provide additional feedback filtering, as desired. Thus, the decision feedback filter 57 is free to compensate for more channel degradation than would be possible if the Tomlinson-Harashima precoder 503 were not utilized. This is particularly important when the values of the coefficients of the taps of the decision feedback filter 57 are clamped, as described with respect to the first aspect of the present invention discussed above. Of course, clamping the coefficients of the taps of the decision feedback filter 57 tends to reduce the effectiveness of the decision feedback filter 57.

Figure 6:
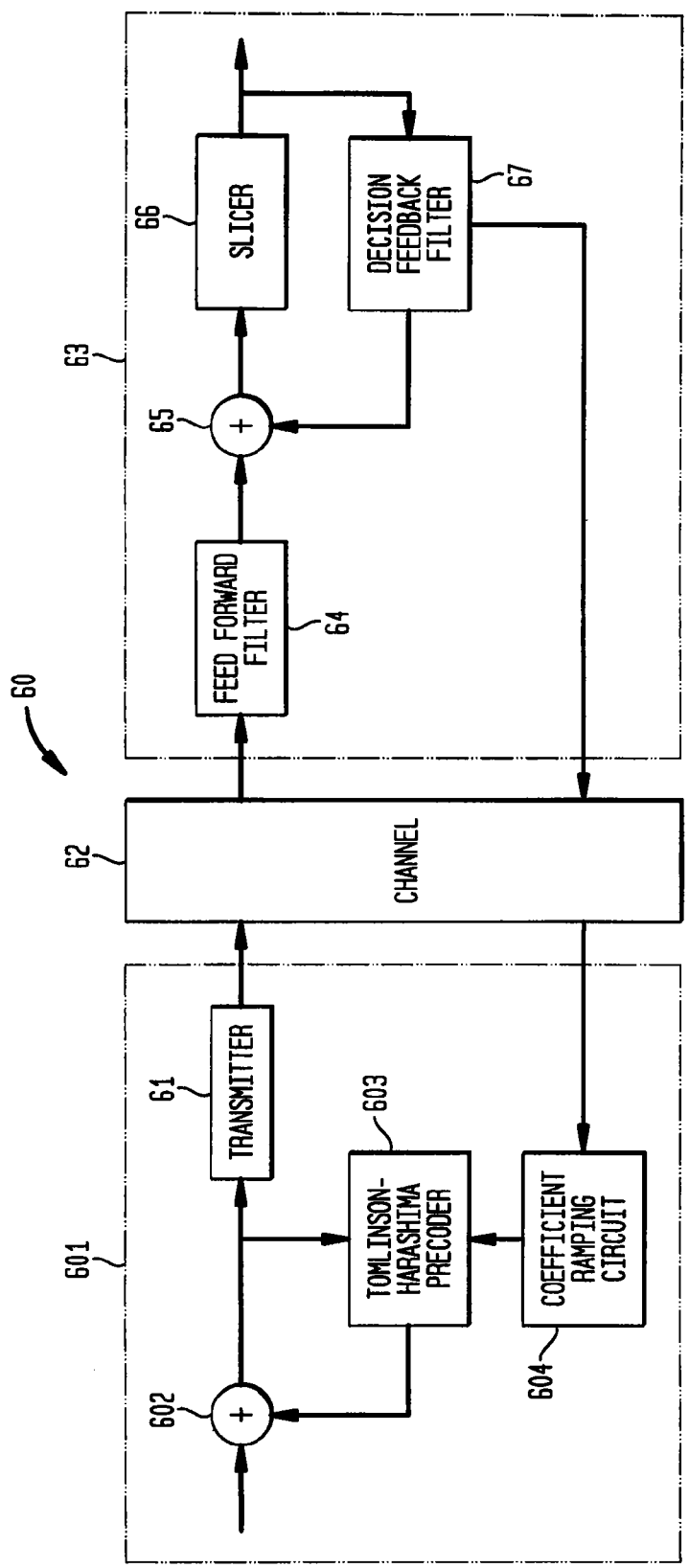
FIG. 6 is a simplified block diagram of two transceivers communicating over a channel, wherein unramped coefficients are transmitted over the channel according to the present invention.

With particular reference to FIG. 6, it is important to note that the coefficient ramping circuit 604 may alternatively be disposed within the transmitting transceiver 601. Indeed, the location of the coefficient ramping circuit 604 is not important and coefficient ramping may, if desired, be performed external to both the transmitting 601 and receiving 63 transceivers, if desired.

As shown in FIG. 6, adder 602 receives information to be transmitted and also receives an output of the Tomlinson-Harashima precoder 603. The adder 602 provides an output to transmitter 61 and to Tomlinson-Harashima precoder 603. Tomlinson-Harashima precoder 603 receives ramped coefficients from coefficient ramping circuit 604. Coefficient ramping circuit 604 receives unramped coefficients from decision feedback filter 67 of the receiving transceiver 63 via channel 62.

Feedforward filter 64 receives information transmitted by transmitter 61 via channel 62 and provides an output to adder 65. Adder 65 provides an output to slicer 66. Slicer 66 provides an output to decision feedback filter 67 and also provides an output for further processing, as discussed above.

Locating the coefficient ramping circuit 604 within the transmitting transceiver 601 has the advantage that only the full values of the decision feedback filter 67 tap coefficients need to be transmitted via the channel 62 from the receiving transceiver 63 to the transmitting transceiver 601, thereby mitigating bandwidth requirements. That is, rather than transmitting each individual ramped coefficient value from the receiving transceiver 63 to the transmitting transceiver 601 via the channel 62, only the final, completely ramped values, need to be transmitted. Then, the intermediate values are provided by the coefficient ramping circuit 604 of the transmitting transceiver 601.

However, locating the coefficient ramping circuit 504 (FIG. 5) within the receiving transceiver 53 has the advantage that the loss of a single packet will only result in the loss of one or more intermediate ramping values, whereas the loss of a single packet transmitted to the coefficient ramping circuit 604 located in the transmitting transceiver 601 may, potentially, result in the loss of the final values, thereby requiring re-transmission of the final values in order for ramping to proceed. Thus, performing coefficient ramping at the receiver provides enhanced fault tolerance at the expense of increased bandwidth requirement.

According to one exemplary use of an adaptive Tomlinson-Harashima precoder, the error term, e, is computed as the difference between the soft decision and the hard decision of the decision feedback equalizer of the receiving transceiver 53, 63. This error term e, is transmitted via the control channel from the receiving transceiver 53, 63 to the transmitting transceiver 501, 601. When the transmitting transceiver 501, 601 receives the error term for a particular tap e(n) of the decision feedback filter 57, 67, then the transmitting transceiver 501, 601 performs a stochastic gradient update on the Tomlinson-Harashima precoder taps. For example, suppose that at tap location k, and at update time n, the tap value is $C_k(n)$, and the data in the tap delay line at position k is xk(n). The new value of $C_k$ at time n+1 is $C_k(n+1)=C_k(n)+\mu*e(n)*x_k(n)$, where $\mu$ is the step size.

Figure 7:
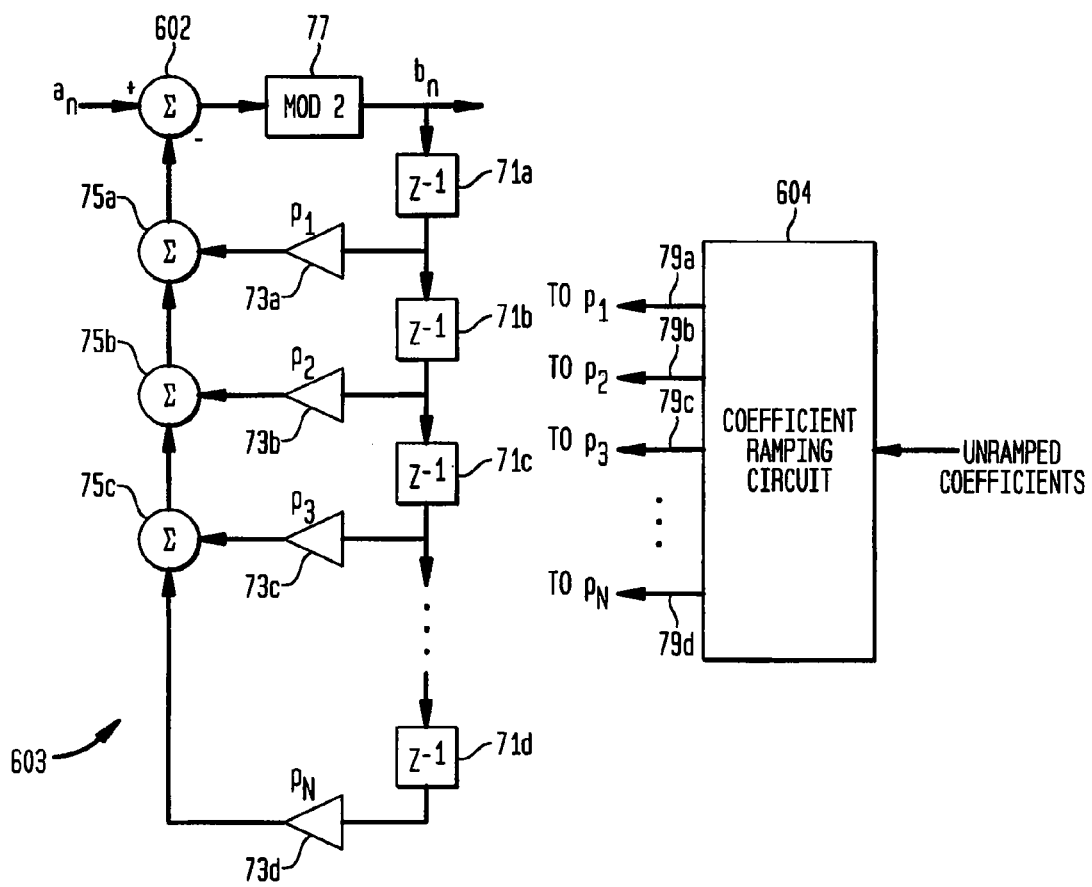
FIG. 7 is a simplified schematic representation of a precoder which receives ramped tap coefficient values according to the present invention.

With particular reference to FIG. 7, cooperation of the coefficient ramping circuit 604 with the Tomlinson-Harashima precoder 603, both also of FIG. 6, is shown. Cooperation of the coefficient ramping circuit 504 with the Tomlinson-Harashima precoder 503, both of FIG. 5, is similar, with the outputs 79a-79d of the coefficient ramping circuit 604 being communicated via the channel 62, rather than being communicated solely within the transmitting transceiver 601. As those skilled in the art will appreciate, Tomlinson-Harashima precoder 603 includes a plurality of delay registers 71a-71d, the output of each of which is modified by taps 73a-73d. Taps 73a-73d contain coefficients p.sub.1-p.sub.N, respectively. The outputs of taps 73a-73d are summed by adders 75a-75c and the outputs of adders 75a-75c are combined with the information to be transmitted via adder 602. Mod2 77 truncates or rounds the output of adder 602 to provide the desired number of bits $b_n$ for input to transmitter 61 (FIG. 6).

The coefficient ramping circuit 604 receives unramped coefficients from the decision feedback filter 67 and ramps the coefficients from an initial value to a final value. The coefficient ramping circuit 604 provides the ramped coefficients $p_1$-$p_N$ to their respective taps 73a-73d.

Generally, ramping is performed by providing initial ramped values at zero and increasing the ramped values until the actual coefficient values of the decision feedback filter 67 are reached. However, as discussed above, the ramped values may start at an initial value other than zero and may continue to a final value which is different from the actual value of the coefficients of the decision feedback filter 67.

Thus, for example, the coefficient ramping circuit 604 may optionally ramp the decision feedback filter 67 coefficient values to a value which is substantially less than the actual decision feedback filter 67 values, such that the decision feedback filter 67 remains active. Alternatively, for example, the coefficient ramping circuit 604 may ramp the coefficient values to a value which results in the decision feedback filter 67 coefficient values being zero. In either instance, the decision feedback filter 67 may, optionally, continue to function, so as to provide additional filtering.

The coefficient ramping circuit 604 may ramp the coefficient values linearly, exponentially or via any other non-linear method desired.

In operation, the decision feedback filter 57, 67 converges, so as to provide tap coefficients which are effective in mitigating post-cursor ISI. After the decision feedback filter 57, 67 has converged, then the coefficient ramping circuit 504, 604 ramps the tap coefficients in the desired manner and provides the ramped coefficient values to Tomlinson-Harashima precoder 503, 603.

As the tap coefficients of the Tomlinson-Harashima precoder 503, 603 are gradually ramped from an initial value to a final value, the signals transmitted by transmitting transceiver 501, 601 to receiving transceiver 53, 63 are modified in a manner which mitigates the need for the decision feedback filter 57, 67 to perform decision feedback filtering. Thus, the tap coefficients of the decision feedback filter 57, 67 gradually decrease in value as the tap coefficients of the Tomlinson-Harashima precoder 503, 603 gradually increase in value. When the tap coefficients of the Tomlinson-Harashima precoder 503, 603 reach their final value, then the corresponding tap coefficients of the decision feedback filter 57, 67 will be at a corresponding final value, generally zero.

Figure 8:
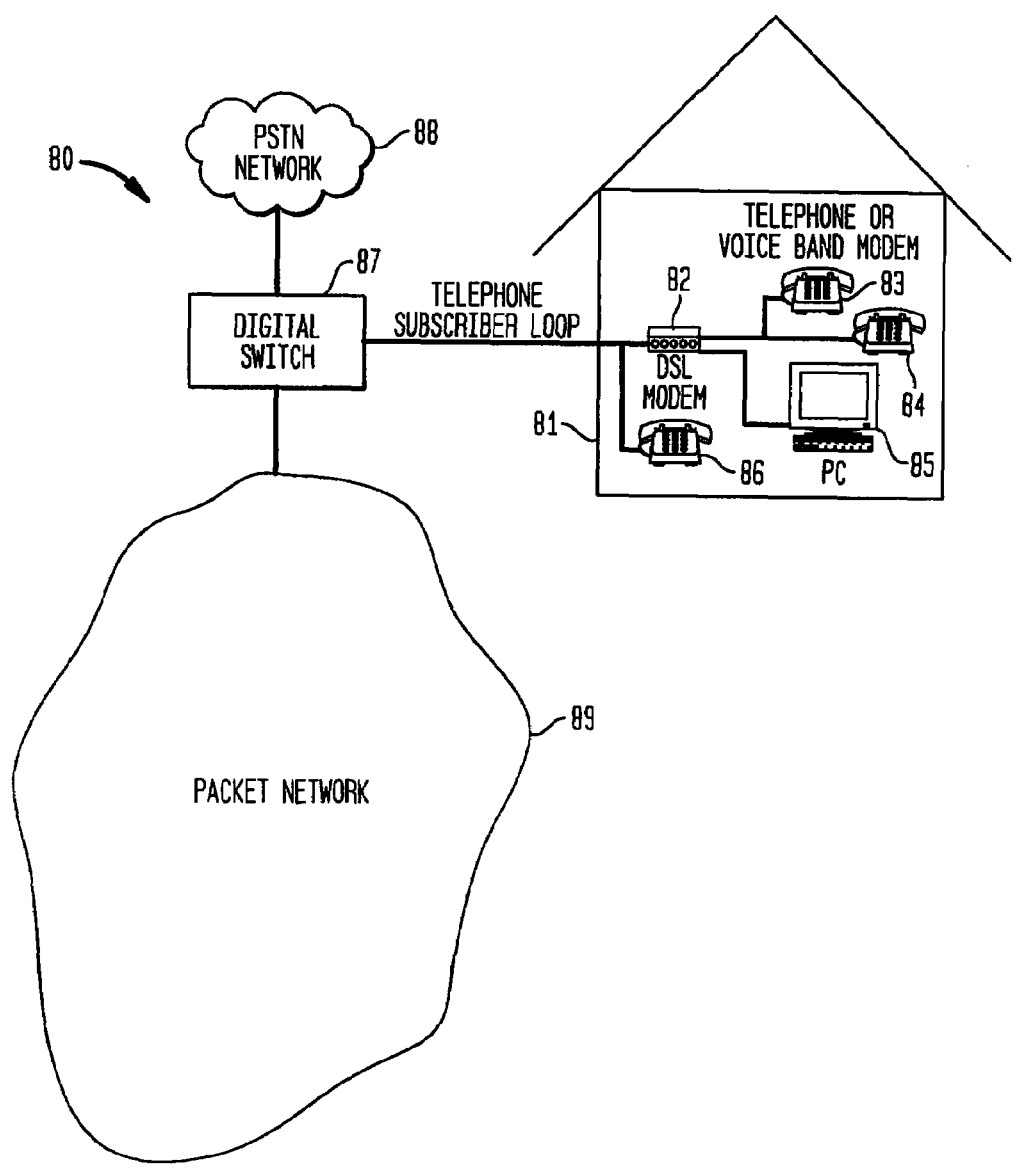
FIG. 8 is a schematic representation of an exemplary application of the present invention wherein the transceivers include DSL modems and the channel includes a packet network.

Referring now to FIG. 8, an exemplary implementation of both aspects of the present invention in a digital subscriber line-up (DSL) system 80 is shown. More particularly, a DSL modem 82 contains a first transceiver and a digital switch 87 contains a second transceiver. The DSL modem 82 facilitates communication of a plurality of telephones 83, 84 and 86, as well as personal computer (PC) 85 with both the public switched telephone (PSTN) network 88 and a packet network 89.

Figure 9:
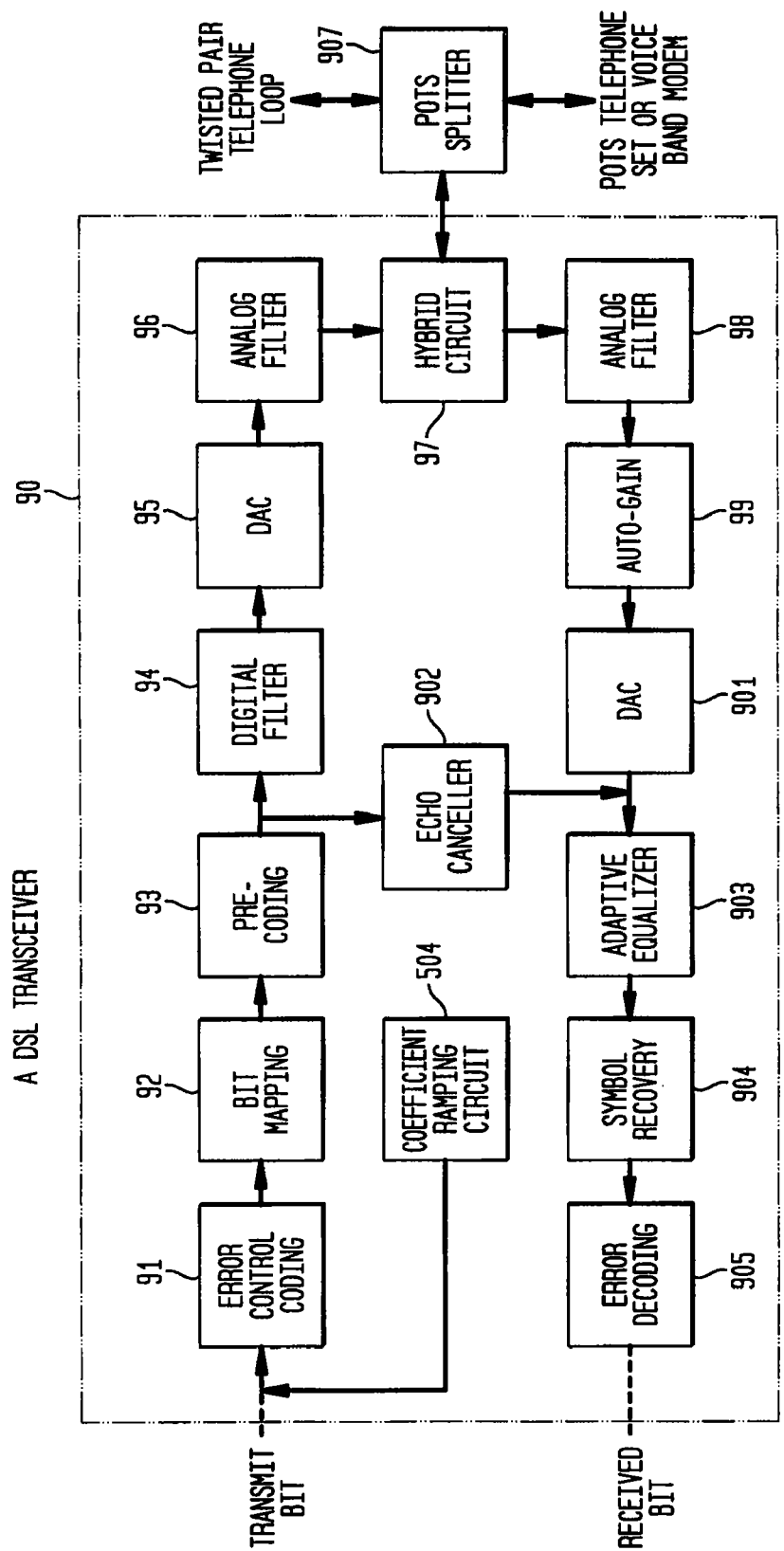
FIG. 9 is a simplified block diagram of a DSL transceiver wherein a coefficient ramping circuit transmits ramped coefficient values over a channel according to the present invention.

Referring now to FIG. 9, a DSL transceiver 90, such as that which is contained both within the DSL modem 82 and a digital switch 87, is shown in further detail. The DSL transceiver receives information to be transmitted (transmit bit). Error control coding 91 is performed upon the transmit bit and then bit mapping 92 and preceding 93 are performed. The output of precoding block 93 is provided to echo canceller 902 to facilitate echo cancellation. Digital filter 94 filters the signal prior to digital-to-analog conversion 95. Analog filter 96 filters the output of digital-to-analog converter 95 prior to providing the signal to hybrid circuit 97 which facilitates splitting of the signal provided to the DSL transceiver 90 via POTS splitter 907. POTS splitter 907 splits the output of DSL transceiver between the twisted pair telephone loop and a contemporary POTS telephone set or voiceband modem. Thus, the POTS splitter 907 facilitates the use of both the DSL transceiver and voiceband equipment on the same twisted pair copper telephone line.

Incoming information from the hybrid circuit is provided to analog filter 98, autogain circuit 99 and digital-to-analog converter 901. Echo canceller 902 operates upon the analog output of digital analog converter 901 to mitigate the undesirable effects of echos.

Adaptive equalizer 903 includes the decision feedback equalizer 57, 67 of the present invention, which includes the feedforward filter 20 and decision feedback filter 37 of FIG. 3 and/or the feedforward filter 54, 64 and decision feedback filter 57, 67 of FIGS. 5 and 6.

The coefficient ramping circuit 504 of FIG. 5 is also in communication with the adaptive equalizer 903. The output of the coefficient ramping circuit 504 is provided to the input of error control coding 91, such that the ramped coefficients may be included in the transmit bit stream. Thus, the DSL transceiver of FIG. 9 is configured so as to transmit ramped decision feedback filter tap coefficients via the channel 52, as shown in FIG. 5.

Figure 10:
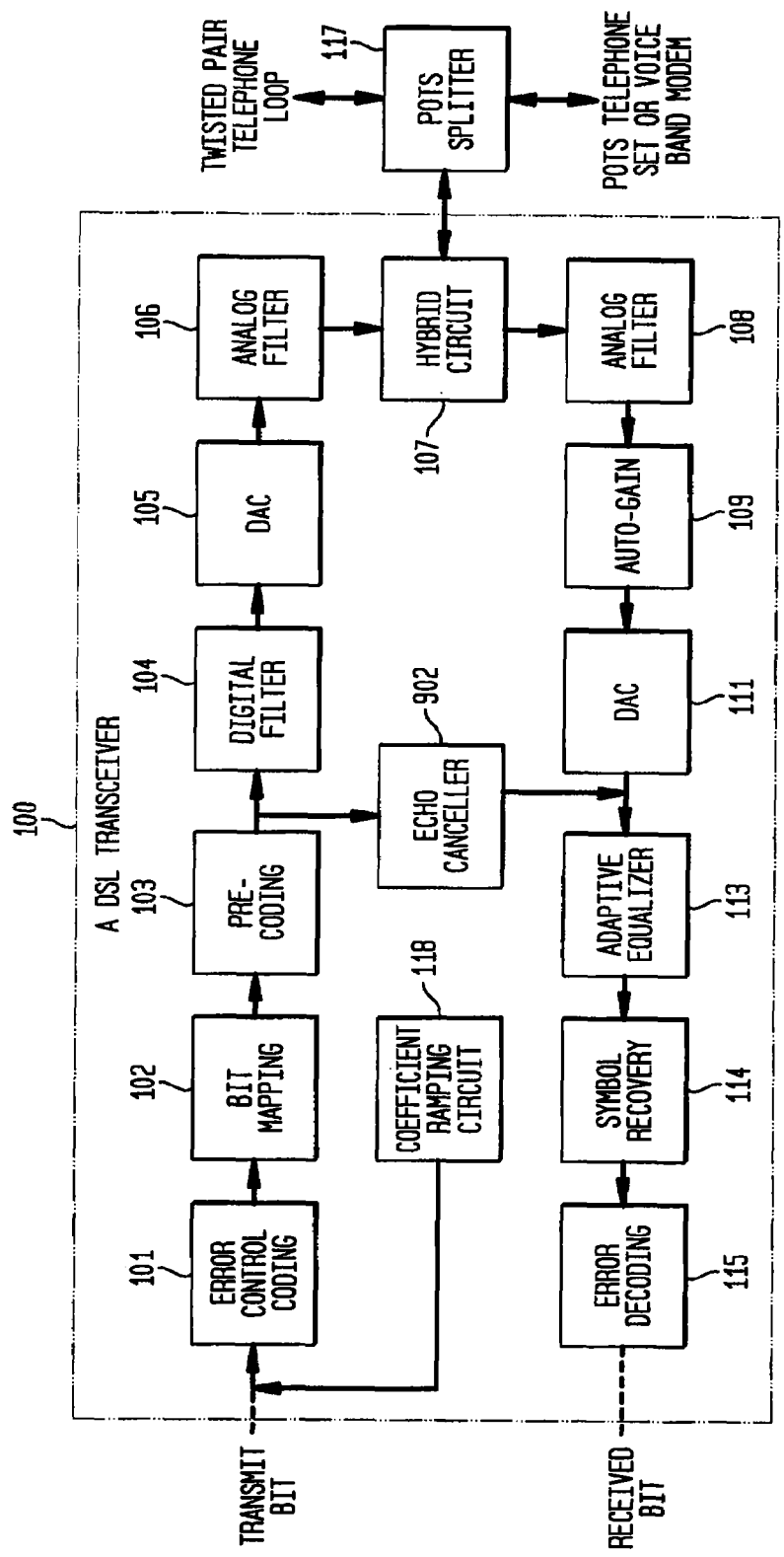
FIG. 10 is a simplified block diagram of a DSL transceiver wherein unramped coefficient values are received from a complimentary DSL transceiver after being transmitted across a channel.

Referring now to FIG. 10, the error control coding 101, bit mapping 102, precoding 103, digital filter 104, digital-to-analog converter (DAC) 105, analog filter 106, hybrid circuit 107, POTS splitter 117, analog filter 108, autogain 109, digital-to-analog converter (DAC) 111, echo canceller 112, adaptive equalizer 113, symbol recovery 114, and error decoding 115 of DSL transceiver 100 are analogous to the corresponding components of the DSL transceiver 90 of FIG. 9. However, as shown in FIG. 10, the coefficient ramping circuit 118 is configured to receive an output of the error decoder 115 and to provide an output to precoder 103. Thus, whereas the DSL transceiver 90 of FIG. 9 is configured to transmit ramped coefficients via a channel, the DSL transceiver 100 of FIG. 10 is configured to receive unramped coefficients from the channel, as shown in FIG. 6.

It is understood that the exemplary DSL equalizer and adaptive Tomlinson-Harashima algorithms described herein and shown in the drawings represent only presently preferred embodiments of the invention. Indeed, various modifications and additions may be made to such embodiments without departing from the spirit and scope of the invention. For example, the present invention is described and illustrated as implemented in a digital subscriber line (DSL) communication system. Those skilled in the art will appreciate that the present invention may be used in a variety of different types of communications systems. Thus, description and illustration of the present invention as implemented in a DSL communication system is by way of illustration only, and not by way of limitation. These and other modifications and additions may be obvious to those skilled in the art and may be implemented to adapt the present invention for use in a variety of different applications.

What is claimed is:

1. A receiver comprising:
    a feedforward filter coupled to process signals received by the receiver, the feedforward filter comprising,
        a plurality of feedforward filter taps for mitigating pre-cursor intersymbol interference, including a feedforward filter reference tap, and
        a coefficient for each feedforward filter tap, wherein the feedforward filter reference tap is located proximate a center position of the plurality of feedforward filter taps;
    a feedback filter coupled to receive signals representative of an output of the feedforward filter, the feedback filter having a plurality of feedback filter taps each having a coefficient, and
    a ramping circuit assembly comprising,
        an input port configured to receive at least one feedback filter tap coefficient from the feedback filter;
        a coefficient ramping circuit configured to provide a ramped output for at least one feedback filter tap coefficient, the ramped output being varied over time from a first value to a second value, the second value being dependent upon the at least one feedback filter tap coefficient, and
        an output port configured to communicate information representative of the ramped output to a precoder.

2. The receiver as recited in claim 1, wherein the ramped output is ramped from a value of approximately zero to a value approximately equal to a value of a feedback filter tap coefficient.

3. The receiver as recited in claim 1, wherein the information representative of the ramped output comprises a difference between a present value of a tap coefficient of the precoder and a new value of the tap coefficient of the precoder.

4. The receiver as recited in claim 1, wherein the ramped output is ramped substantially linearly.

5. The receiver as recited in claim 1, wherein the ramped output is ramped non-linearly.

6. The receiver as recited in claim 1, wherein the ramped output is ramped substantially exponentially.

7. The receiver as recited in claim 1, wherein each of the coefficients of the feedback filter taps is clamped so as to mitigate error propagation.

8. The receiver as recited in claim 1, wherein the feedforward filter and the feedback filter cooperate to at least partially define a feedback equalizer.

9. The receiver as recited in claim 1, wherein the feedforward filter and the feedback filter cooperate to define a portion of a DSL receiver.

10. A transceiver comprising:
    a precoder;
    a feedforward filter coupled to process signals received by a receiver, the feedforward filter having a plurality of feedforward filter taps for mitigating pre-cursor intersymbol interference, including a feedforward filter reference tap;
    a feedback filter coupled to receive signals representative of an output of the feedforward filter, the feedback filter having a plurality of feedback filter taps each having a coefficient, wherein the feedforward filter reference tap is located proximate a center position of the plurality of feedforward filter taps, so as to enhance noise cancellation and each of the feedforward filter taps has a coefficient; and
    a ramping circuit assembly, the ramping circuit assembly comprising
        an input port configured to receive at least one feedback filter tap coefficient from the feedback filter,
        a coefficient ramping circuit configured to provide a ramped output for the at least one feedback filter tap coefficient, the ramped output being varied over time from a first value to a second value, the second value being dependent upon the at least one feedback filter tap coefficient, and
        an output port configured to communicate information representative of the ramped output to a precoder of a complimentary transceiver.

11. The transceiver as recited in claim 10, wherein the ramped output is ramped from a value of approximately zero to a value approximately equal to a value of a feedback filter tap coefficient.

12. The transceiver as recited in claim 10, wherein the information representative of the ramped values comprises a difference between a present value of a tap coefficient of the precoder of the complimentary transceiver and a new value of the tap coefficient of the precoder of the complimentary transceiver.

13. The transceiver as recited in claim 10, wherein the ramped output is ramped substantially linearly.

14. The transceiver as recited in claim 10, wherein the ramped output is ramped non-linearly.

15. The transceiver as recited in claim 10, wherein the ramped output is ramped substantially exponentially.

16. The transceiver as recited in claim 10, wherein each of the coefficients of the feedback filter taps is clamped so as to mitigate error propagation.

17. A receiver comprising:
a feedforward filter coupled to process signals received by the receiver, the feedforward filter comprising a plurality of feedforward filter taps for mitigating pre-cursor intersymbol interference (ISI), including a feedforward filter reference tap, wherein the feedforward filter reference tap is located proximate a center position of the plurality of feedforward filter taps;
a feedback filter coupled to receive signals representative of an output of the feedforward filter, the feedback filter having a plurality of feedback filter taps; and
means for providing a ramped output for at least one feedback filter tap coefficient, the ramped output being varied over time from a first value to a second value, the second value being dependent upon at least one feedback filter tap coefficient.

18. The receiver as recited in claim 17, wherein the ramped output is ramped from a value of approximately zero to a value approximately equal to a value of a feedback filter tap coefficient.

19. The receiver as recited in claim 17, wherein the ramped output is ramped substantially linearly.

20. The receiver as recited in claim 17, wherein each of the feedback filter taps has a coefficient and a value of each of the coefficients of the feedback filter taps is clamped so as to mitigate error propagation.

* * * * *